(12) United States Patent
Kurd et al.

(10) Patent No.: US 7,102,402 B2
(45) Date of Patent: Sep. 5, 2006

(54) CIRCUIT TO MANAGE AND LOWER CLOCK INACCURACIES OF INTEGRATED CIRCUITS

(75) Inventors: Nasser A. Kurd, Portland, OR (US); Javed S. Barkatullah, Portland, OR (US); Charles Dike, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 658 days.

(21) Appl. No.: 10/154,754

(22) Filed: May 23, 2002

(65) Prior Publication Data

US 2003/0221143 A1   Nov. 27, 2003

(51) Int. Cl.
*H03L 7/06* (2006.01)
(52) U.S. Cl. ............................. 327/158; 327/161
(58) Field of Classification Search .............. 327/147, 327/149, 151, 153, 158, 160–161
See application file for complete search history.

(56) References Cited

U.S. PATENT DOCUMENTS

| | | | | |
|---|---|---|---|---|
| 6,100,735 A | * | 8/2000 | Lu ............................. | 327/158 |
| 6,327,318 B1 | * | 12/2001 | Bhullar et al. ............. | 375/374 |
| 6,486,716 B1 | * | 11/2002 | Minami et al. ............. | 327/152 |
| 6,501,311 B1 | * | 12/2002 | Lutkemeyer ................ | 327/161 |
| 6,526,109 B1 | * | 2/2003 | Chang et al. ............... | 375/371 |
| 6,639,958 B1 | * | 10/2003 | Hohler et al. .............. | 375/376 |
| 6,664,830 B1 | * | 12/2003 | Miller ........................ | 327/158 |

\* cited by examiner

*Primary Examiner*—Terry D. Cunningham
*Assistant Examiner*—Cassandra Cox
(74) *Attorney, Agent, or Firm*—Blakely, Sokoloff, Taylor & Zafman LLP (57) ABSTRACT

A circuit for generating and distributing highly accurate and stable clocks on a large integrated die is described. A Digital De-skew System is used to help prevent metastability and dither, provide a wide controllable delay range, and alternate sampling of phase detectors.

14 Claims, 7 Drawing Sheets

CIRCUIT TO MANAGE AND LOWER CLOCK INACCURACIES OF INTEGRATED CIRCUITS

FIELD OF THE INVENTION

The present invention pertains to the field of circuit design in integrated circuits. More particularly, the present invention relates to a clocking circuit for helping to reduce or prevent skew, metastability, dither, and jitter in the clock distribution network.

BACKGROUND OF THE INVENTION

Most integrated circuits such as a microprocessor consist of multiple circuit elements fabricated on a semiconductor material such as silicon. Generally, a clock signal is routed to many, if not most, of the circuit elements. This clock signal is used for the timing of the circuit elements.

The current trends in integrated circuit design are toward smaller device dimensions, higher levels of integration, and higher operating frequencies. Unfortunately, these trends tend to increase clocking inaccuracies. In order to meet narrowed timing requirements associated with higher operating frequencies, it would be desirable to not only prevent increased clocking inaccuracies, but to decrease clocking inaccuracies. Thus, generating and distributing highly accurate and stable clocks on a large integrated die present a challenge.

Figure 1:
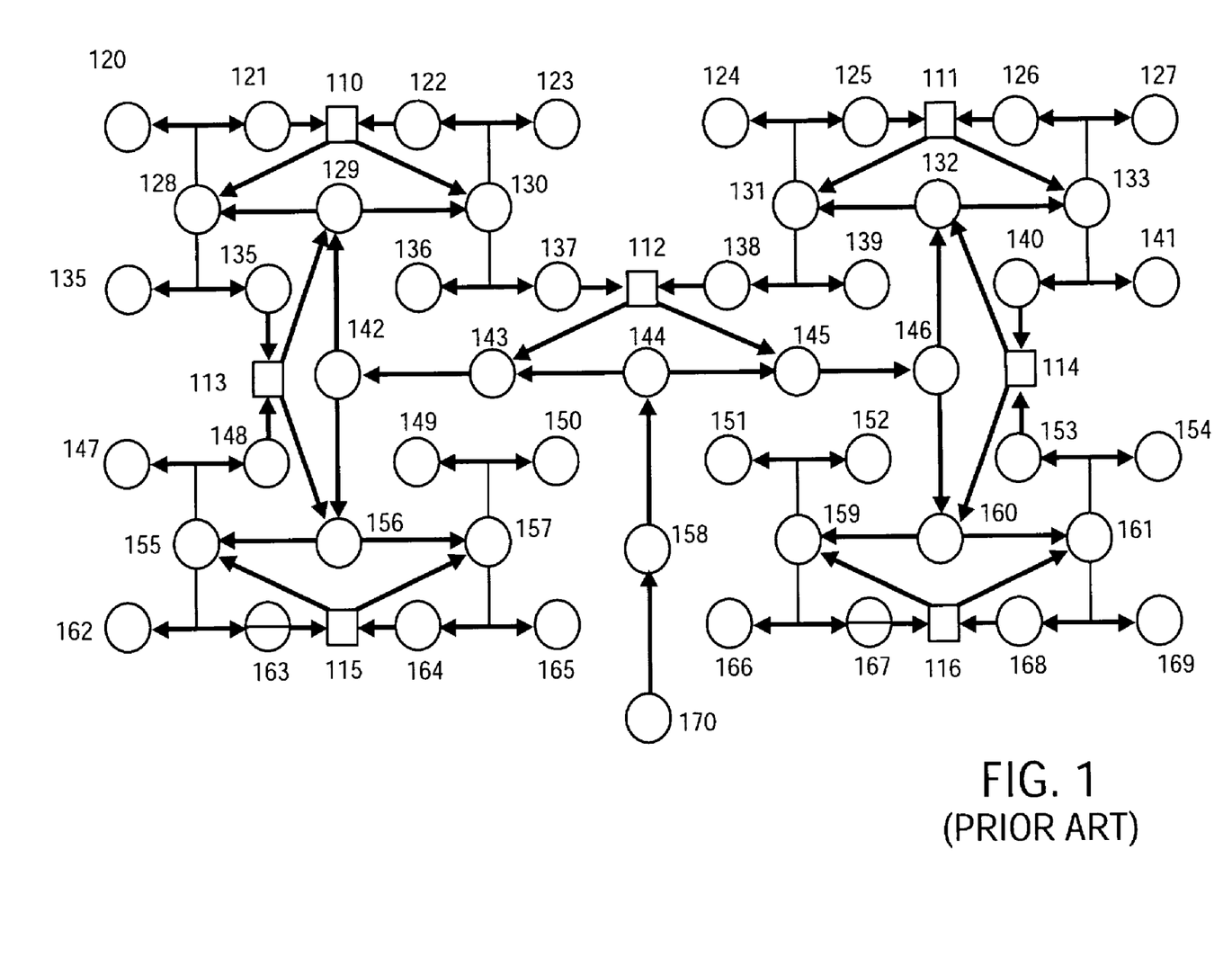
FIG. 1 is a diagram of a prior art Digital De-Skew System in an integrated circuit clocking scheme.

One method to manage and lower clock inaccuracies is to incorporate a Digital De-skew System (DDS) in the global clock distribution of an integrated circuit. The integrated circuit die is typically divided into domains. A DDS is then inserted between domains to dynamically or statically lower the clock skew between them. A DDS typically consists of phase detectors, buffer control circuits, and adjustable buffers distributed throughout a clock distribution structure. FIG. 1 shows an example of such a DDS in a global clock distribution of an integrated circuit. The phase detectors 110–116 measure the phase error between two clocks and generate lead/lag signals depending on the relationship between the two clocks. The lead/lad signals are then processed by buffer control circuits which control the adjustable buffers 128–133, 143, 145, 155–157, 159–161.

Figure 2:
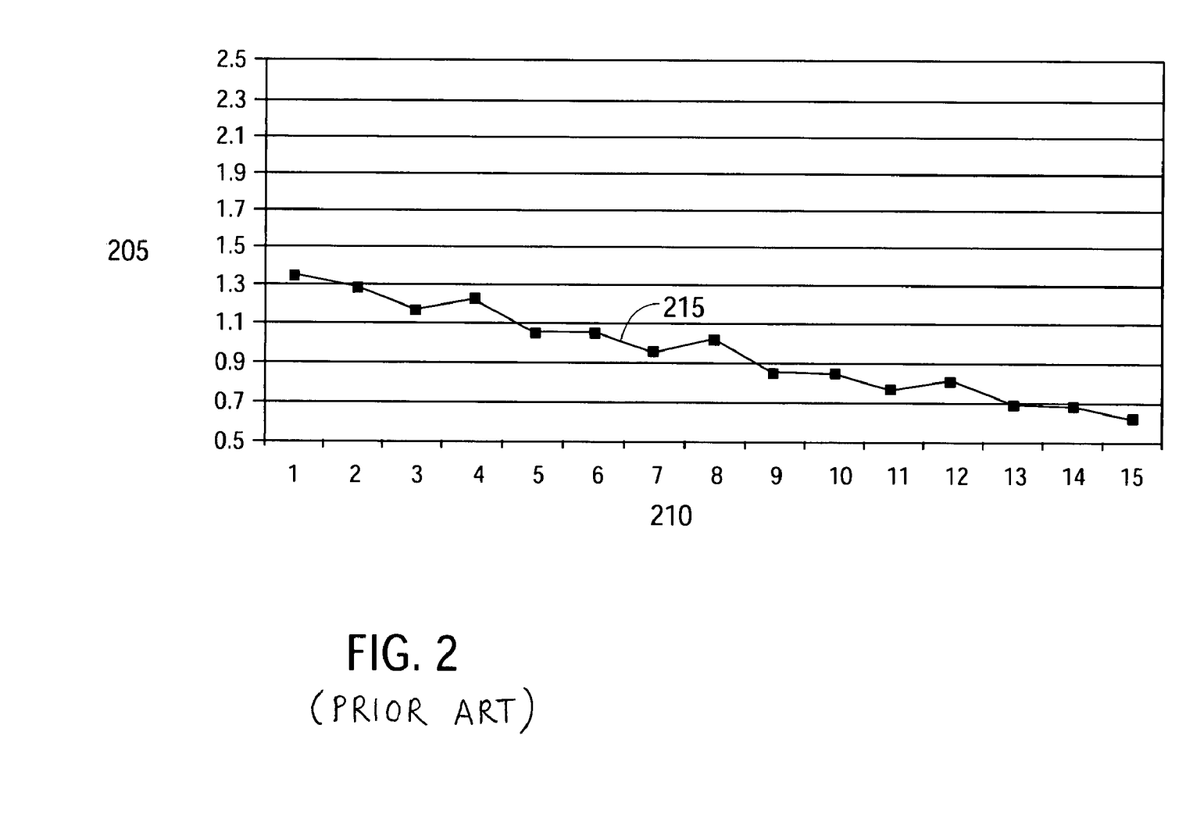
FIG. 2 is a graph of a prior art delay buffer.

Existing DDS' typically suffer from at least three problems. A first problem is that the generated delays from the adjustable buffers are not linear. FIG. 2 shows a graph of an output 215 of a nonlinear delay buffer. The y-axis 205 represents adjustable delay steps of the buffer measured in picoseconds. The x-axis 210 represents control bits that adjust the buffer. In order to achieve stability and convergence within a DDS, the delay steps of the buffer should be linear. Output 215, however, is not linear; delay steps gradually decrease as the control bit value asserted increases. Nonlinearity decreases the controllable delay range of the buffer.

A second problem is metastability and dither. Metastability may occur when a phase detector detects two perfectly aligned incoming clocks under ideal conditions. In contrast, dither may occur when the phase detector detects a phase difference between two clocks, but the delay step is too large to correct the difference between the two clocks. Thus, the phase error between the two clocks toggle around an equilibrium point.

A third problem is jitter when updates occur. Jitter is any cycle to cycle variation in a clock. In general, the larger the change in generated delays, the larger the resulting clock jitter.

Therefore, it would be desirable for a DDS to generate linear delays having a wide controllable delay range, detect phase differences without being susceptible to metastability and dither, and prevent large sudden changes in generated delays.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Figure 3:
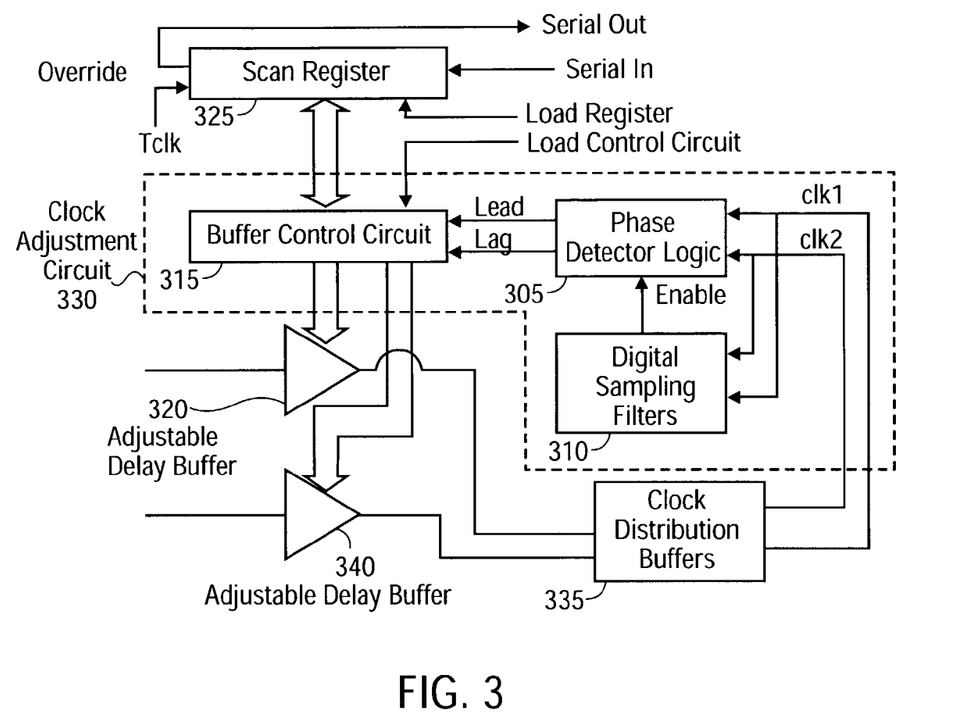
FIG. 3 is a diagram of a modified Digital De-Skew System in an integrated circuit clocking scheme.
Figure 6:
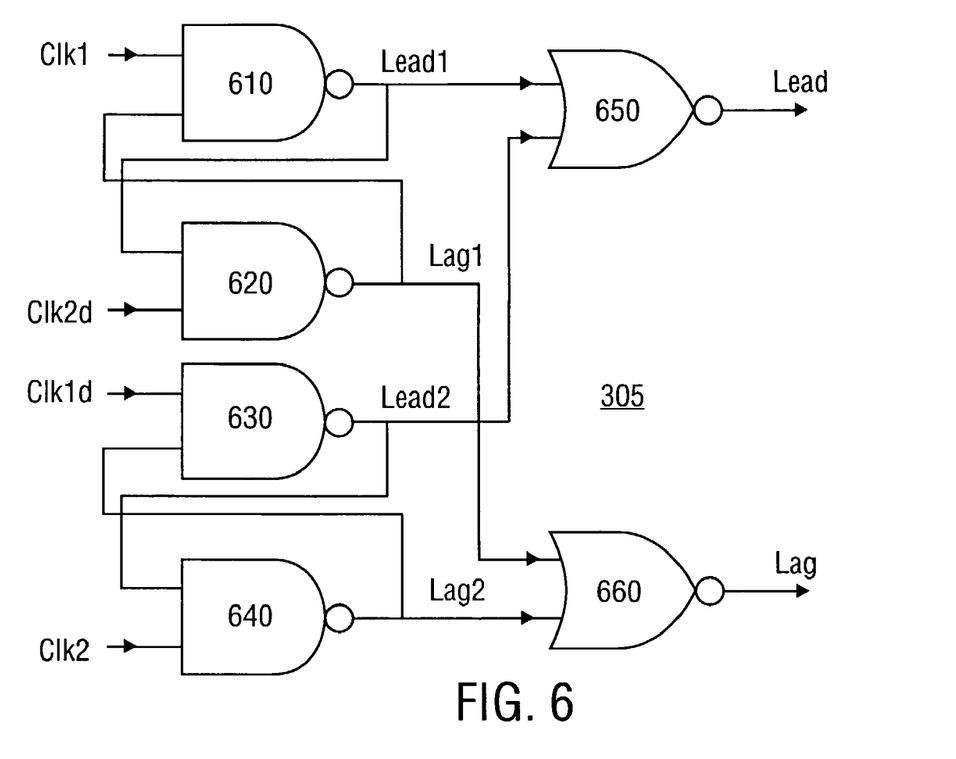
FIG. 6 is a diagram of a phase detector that helps to prevent metastability and dither.

FIG. 3 depicts one embodiment of a modified DDS as taught by the present invention designed to help provide linearly adjustable delay buffers, prevent dither and metastability, and reduce jitter. Phase detector 305 receives two clocks of a clock distribution network as input and compares the two clocks. The clock distribution network may comprise a plurality of clock buffers 335. Depending on the phase relationship between input clocks, phase detector 305 generates lead/lag signals that are coupled to a buffer control circuit 315. Phase detector 305 is shown in FIG. 6 and is discussed in further detail below. The buffer control circuit 315 generates binary signals that increase or decrease step delays of adjustable delay buffers 320 and 340. The adjustable delay buffers 320 and 340 may then be coupled to clock distribution buffers 335. For one embodiment of the invention, buffer control circuit 315 is a shift register. For another embodiment of the invention, buffer control circuit 315 is an up/down counter.

Phase detector 305 is also coupled to a digital sampling filter 310. The digital sampling filter 310 controls the sampling of clocks by the phase detector 305 to ensure system stability. For one embodiment of the invention, the digital sampling filters 310 may be a divider circuit that masks out a fraction of the input clock edges. The digital sampling filter 310 is discussed in further detail below.

A scan register 325 is coupled to the buffer control circuit 315 to provide test functionality to the system. The scan register 325 is thus only enabled in a testing mode. The DDS may enter testing mode when either a load register signal or a load control circuit signal is asserted. If the load register signal is asserted, data is read from the DDS. Otherwise, if the load control circuit signal is asserted, data is written to the DDS. A test clock input, Tclk, determines the speed in which data is read from or written to the DDS during testing mode.

Figure 4:
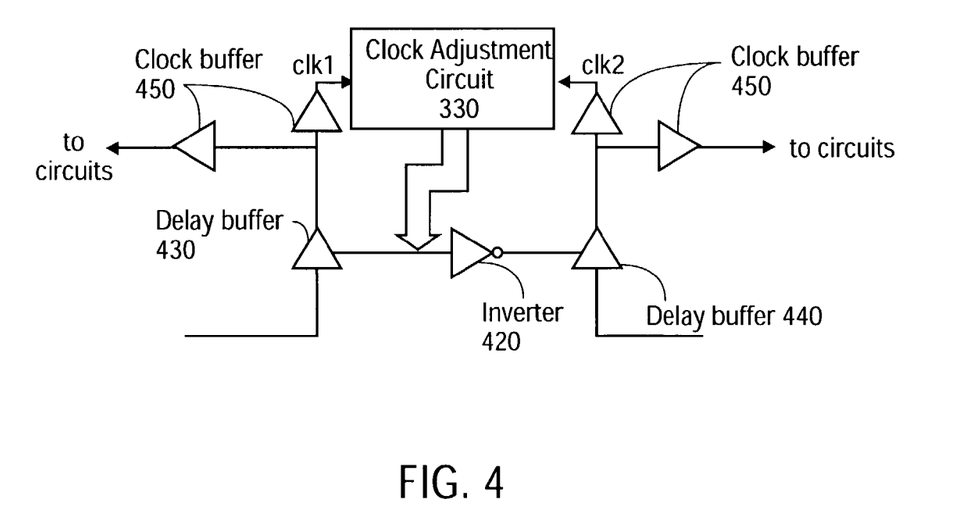
FIG. 4 is a diagram of a circuit for generating linear adjustable delays.

FIG. 4 depicts one embodiment of a DDS that generates linearly adjustable delays. As shown in FIG. 2, buffers in integrated circuits often generate delays which are not linear over the entire adjustable range. Linear delay steps, however, help to achieve system stability and convergence. In FIG. 4, clock adjustment circuit 330 comprises a digital sampling filter, a phase detector, and an up/down counter. The clock adjustment circuit 330 is coupled to delay buffers 430 and 440. Delay buffers 430 and 440 are coupled to a plurality of clock buffers 450.

The clock adjustment circuit 330 receives as input two clock signals from a clock distribution network of an integrated circuit. Ideally, the two input clock signals are aligned with respect to one another. If there is a skew or phase error between the two incoming clocks, clock adjustment circuit 330 generates binary control signals to increase or decrease the step delay of delay buffers 430 and 440. For one embodiment of the invention, inverter 420 inverts the control signal coupled to delay buffer 440. The control signal coupled to delay buffer 430 is not inverted. As a result, if the delay of delay buffer 430 is increased, the delay of delay buffer 440 is decreased. Further, if the delay of delay buffer 430 is decreased, the delay of delay buffer 440 is increased.

Figure 5A:
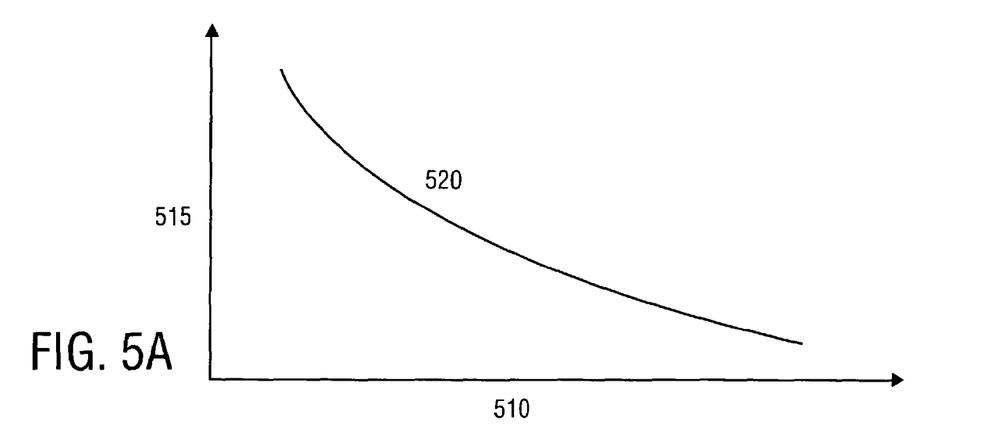
FIG. 5A is a graph of an output signal of a delay buffer.
Figure 5B:
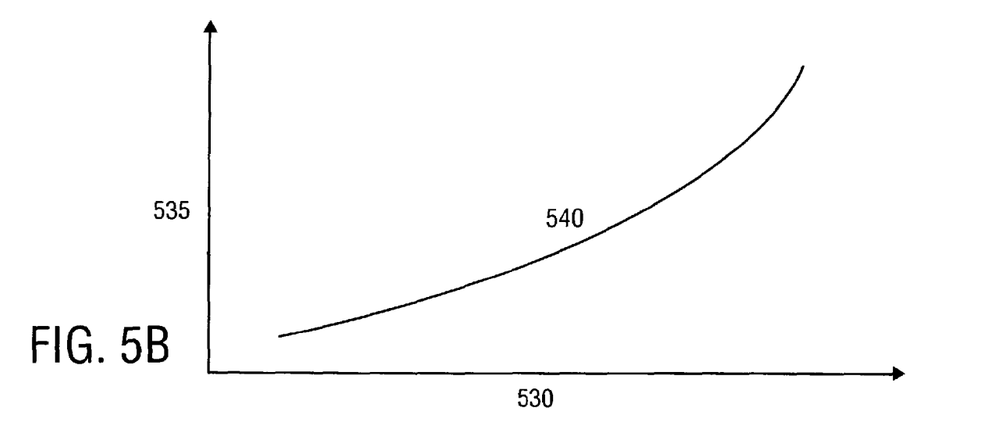
FIG. 5B is a graph of an output signal of a delay buffer having inverted control bits.
Figure 5C:
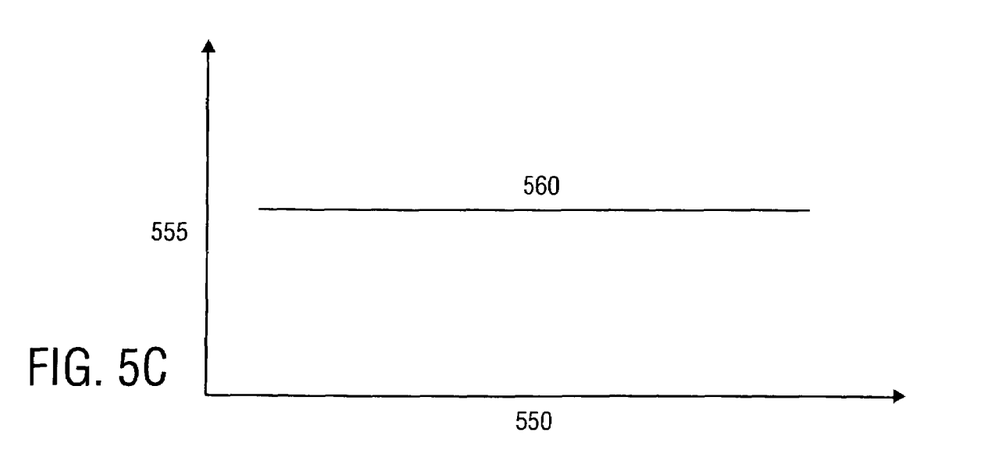
FIG. 5C is a graph of an ideal output signal of a circuit that combines a first delay buffer and a second delay buffer having inverted control bits.

FIGS. 5A, 5B, and 5C depict graphs of the operation of the DDS of FIG. 4 that generates linearly adjustable delays. Specifically, FIG. 5A is a graph of the output signal generated by delay buffer 430. X-axis 510 represents the adjustable control bits of delay buffer 430 and y-axis 515 represents the step delay of each asserted control bit as measured in picoseconds. Signal 520 is the output delay of delay buffer 430. As shown by FIG. 520, the step delay gradually decreases with each increased control bit asserted.

Similarly, FIG. 5B is a graph of the output signal generated by delay buffer 440. X-axis 530 represents the adjustable control bits as controlled by circuit adjustment circuit 330. Y-axis 535 represents the step delay as measured in picoseconds. Signal 540 is the output delay output of delay buffer 440. However, because the control bits of delay buffer 440 is inverted with respect to the control bits of delay buffer 430, as the number of control bits 510 enabled is increased, the step delay of each additional control bit gradually increases with respect to the previously asserted control bit as shown by the signal 540.

Therefore, when signals 520 and 540 are combined or used in conjunction with one another as in FIG. 5C, the resulting generated delay between the buffers 430 and 440 is linear as shown by signal 560. The x-axis 550 represents the control bits asserted by clock adjustment circuit 330 and the y-axis 555 represents the step delay of combined delay buffers 430 and 440 as measured in picoseconds.

Figure 5D:
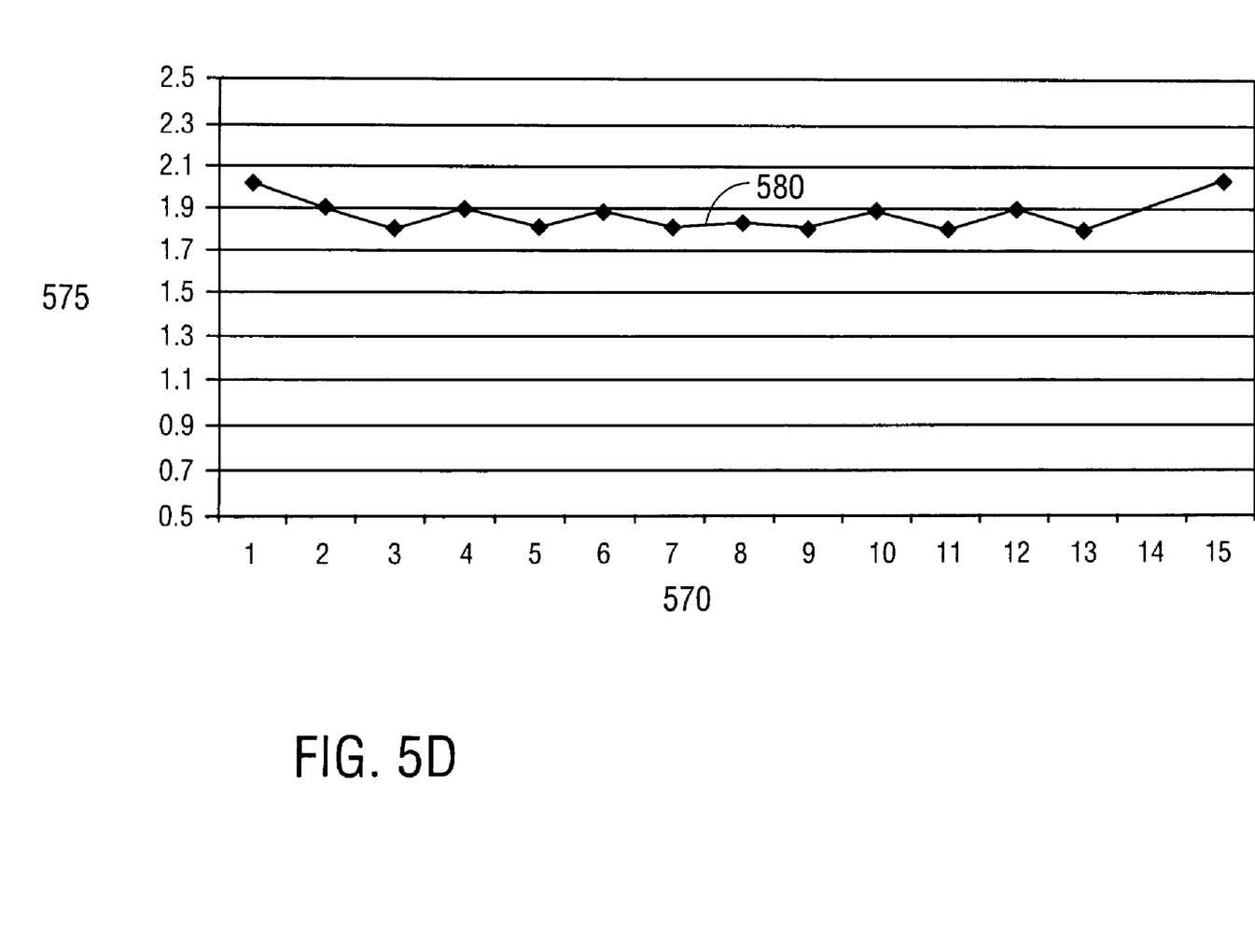
FIG. 5D is a graph of a simulation output of a circuit that combines a first delay buffer and a second delay buffer having inverted control bits.

FIG. 5D depicts a graph of actual simulation results of the buffer of FIG. 4. X-axis 570 represents the adjustable control bits as controlled by clock adjustment circuit 330. Y-axis 575 represents the step delay as measured in picoseconds. Signal 580 is the effective delay change of delay buffers 430 and 440. When compared with FIG. 2, it can be seen that the graph of linearity of the step delays have been improved. Moreover, since each step delay has been increased, the delay range has also been widened.

Even though the circuit of FIG. 4 helps to provide linear step delays, the circuit on its own may still be susceptible to dither. As discussed above, dither occurs when the step delay adjustments are too large to correct the difference between two clocks causing the phase error to toggle around an equilibrium point. As an example, clk1 and clk2 are two input clocks to a phase detector 305 as shown in FIG. 3. There is a skew between clk1 and clk2, wherein clk1 leads clk2 by two picoseconds. The phase detector 305 is coupled to an up/down counter 315, which generates a binary control signal. The control signal adjusts delay buffers 430 and 440 to compensate for the skew. However, the delay buffer has a step delay of three picoseconds. Therefore, after correction, clk2 will lead clk1 by one picosecond. Because the step delay of the delay buffers are greater than the actual clock skew, the DDS is in dither. Thus, in this example, the phase error between the clocks toggle between 2 picoseconds and minus one picosecond.

FIG. 6 depicts one embodiment of a phase detector circuit 305 used to help prevent dither. The circuit comprises NAND combinational gates 610, 620, 630, and 640 and NOR combinational gates 650 and 660 of FIG. 8. NAND gates 610 and 620 are coupled to each other and to NOR gates 650 and 660. NAND gates 630 and 640 are coupled to each other and to NOR gates 650 and 660. As stated above, two clocks are input to the phase detector 305. For reference, the input clocks are named clk1 and clk2 in this instance. NAND gates 620 and 630 are sized slower to emulate a delayed copy of clk1 and clk2, referred to as clk1*d* and clk2*d*.

Figure 7:
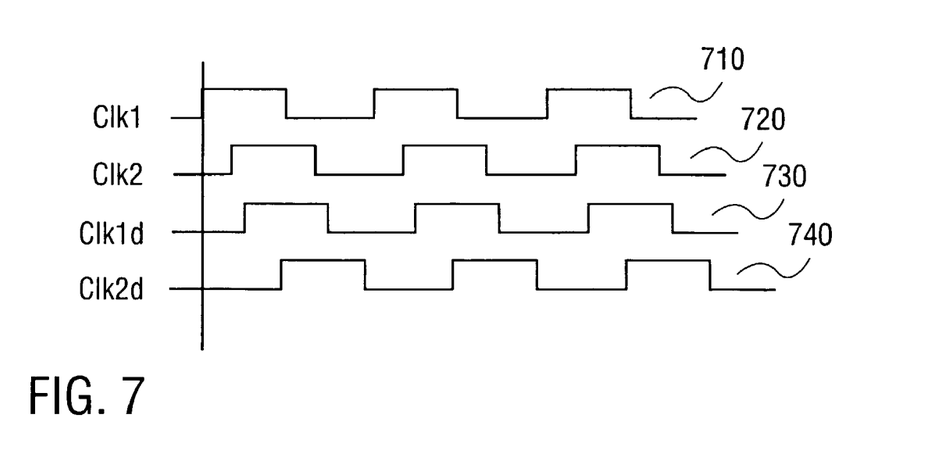
FIG. 7 is a graph of signals from the phase detector.

Using the previous example where clk1 leads clk2 by two picoseconds, signals 710 and 720 of FIG. 7 depict the relationship between clk1 and clk2. Moreover, clk1*d* and clk2*d* are also depicted as signals 730 and 740. The phase detector of FIG. 6 compares the rising edges of clocks clk1 with clk2*d* and clk2 with clk1*d*. The phase detector 305 then generates lead/lag signals (lead1, lag1, lead2, and lag2) from NAND gates 610, 620, 630, and 640 respectively. Lead1 is asserted if clk1 leads clk2*d*; lag1 is asserted if clk1 lags clk2*d*; lead2 is asserted if clk1*d* leads clk2; and lag2 is asserted if clk1*d* lags clk2.

The amount of delay (e.g. the delay of clk1*d* with respect to clk1 and clk2*d* with respect to clk2) created by the sizing of NAND gates 620 and 630 establishes a dither control threshold. Thus, if clk1 and clk2 skews are within the threshold, then neither lead or lag signals are asserted and the buffers 430 and 440 do not change delays. The lead signal output from NOR gate 650 is asserted only if both lead1 (clk1 leads clk2*d*) and lead2 (clk1*d* leads clk2) signals are both asserted indicating clk1 is leading clk2 by at least the delay threshold.

Likewise, the lag signal output from NOR gate 660 is asserted only if both lag1 (clk1 lags clk2*d*) and lag2 (clk1*d* lags clk2) signals are both asserted indicating clk1 is lagging clk2 by at least the delay threshold. When the skew between clk1 and clk2 is less than the threshold, then the lead or lag signal remains low. As a result, a delay threshold is established, which helps to eliminate dither.

In the example of FIG. 7, the dither control threshold is set to be three picoseconds, the delay threshold is three picoseconds, and clk1 leads clk2 by two picoseconds. As a result, lead1 will be asserted since clk1 leads clk2d. Lead2, however, will not be asserted since clk1d does not lead clk2. Clk1d, in fact, lags clk2 by one picosecond in this example. Because lead1 is asserted and lead2 is not asserted, the lead signal output from NOR gate 650 remains low. The lead and lag signals of phase detector 305 do not change the delay of the buffers 430 and 440 unless the clock skew is measured to be greater than the established delay threshold.

In the event that the clock skew is equal to the established delay threshold, metastability could occur at the output of the NAND gates 610, 620, 630, and 640. Metastability is the condition where a circuit node is in neither an asserted state nor a deasserted state. Metastability in a circuit is highly undesirable because the circuit may be unable to generate valid results until the circuit exits the metastable state and enters into a known state. Metastability, however, will only occur in phase detector 305 at either lead1/lag1 or lead2/lag2 because of the introduced delays of NAND gates 620 and 630. Therefore, at least one input of the NOR gates 650 and 660 will be at a known voltage state.

Figure 8:
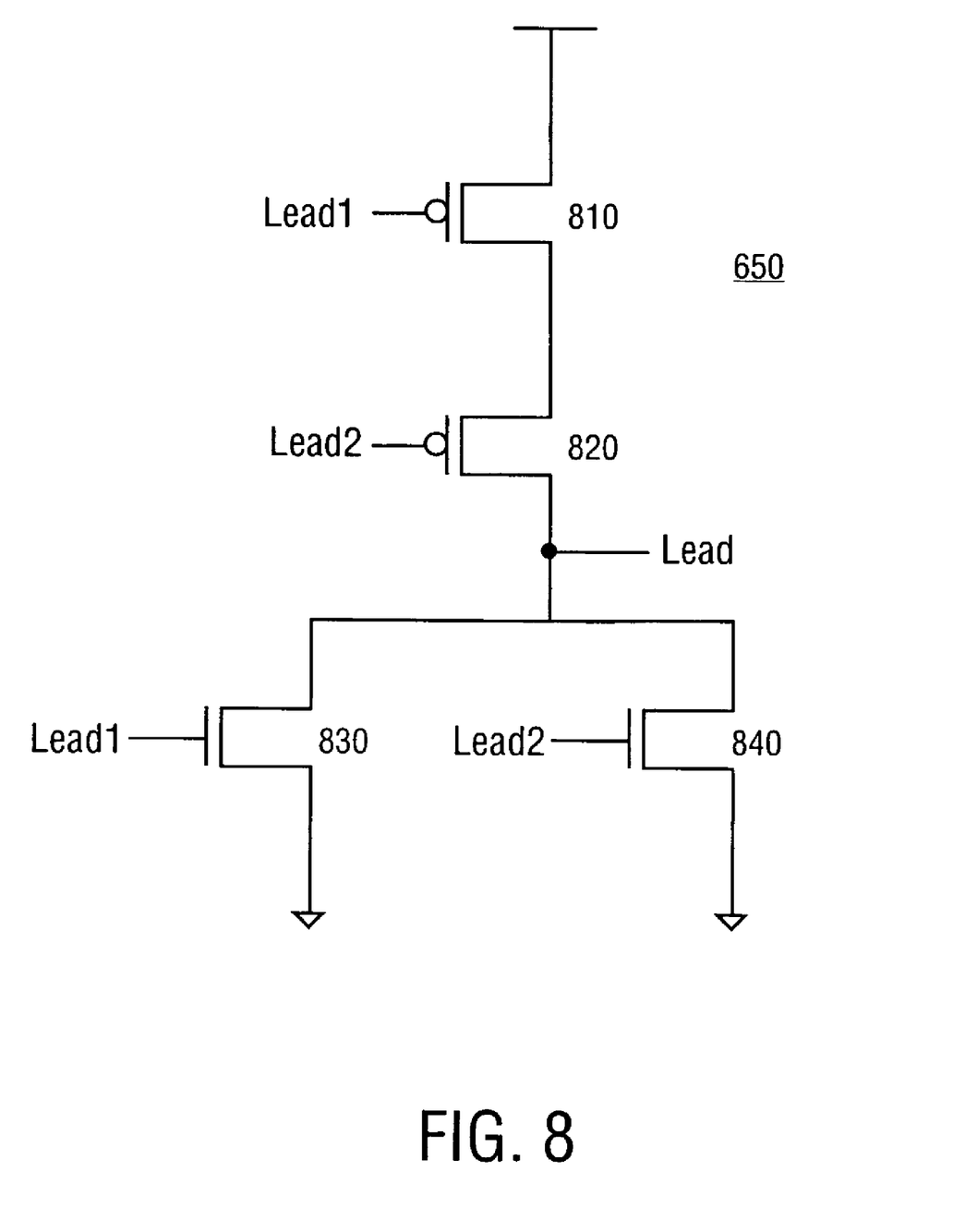
FIG. 8 is a NOR gate used in the phase detector.

The transistors of the NOR gates 650 and 660 must be sized to ensure that the NOR gate will generate a low signal in the instance where one of the inputs is in a metastable state. FIG. 8 depicts such a NOR gate. In this circuit, p-transistors 810 and 820 are sized such that n-transistors 830 and 840 have greater transistor widths than p-transistors 810 and 820. Thus, if an input to NOR gates 650 and 660 is in a metastable state, the NOR gates 650 and 660 will output a low signal since the transistors are sized such that the width of the n-transistors 830 and 840 are greater than the widths of the p-transistors 810 and 820 in addition to the mobility difference between p-transistors and n-transistors. The circuit of FIG. 8 helps to ensure a known voltage value to be output at the NOR gates 650 and 660 at the expense of slight voltage contention. The voltage contention would be negligible since the p-transistors are significantly weaker than the n-transistors.

The negative effects of metastability may also be minimized in a DDS through the use of the digital sampling filter 310. As stated above, the digital filter 310 controls the sampling of clocks. By periodically sampling input clocks instead of sampling on every rising or falling clock transition, the phase detector 305 is given more time to resolve metastability conditions. In addition, periodic sampling gives the phase detector 305 more time to resolve glitches in input clocks.

The digital sampling filter may also be used to stagger the sampling of input clocks through the use of periodic sampling. In a dynamic DDS having multi-levels in the clocking network, all updates typically occur at the same. This potentially creates large changes in delays since all delay buffers are adjusted simultaneously. The large changes in delays can cause clock jitter. Therefore, staggering, or alternating sampling, of different levels of the clocking network help to reduce jitter and improve stability.

For one embodiment of the invention, staggered sampling is implemented in the digital sampling filter 310 using a counter. The counter enables the phase detector 305 during only when certain specified counter values are reached.

For another embodiment of the invention, staggered sampling is implemented in the digital sampling filter 310 using a control signal generated by a state machine or processor. The state machine or processor controls when the phase detector 305 is enabled.

Finally, the digital sampling filter helps to reduce bandwidth. Clock adjustments in a DDS depend upon the several components. Components such the phase detector 305, up/down counter 315, and adjustable delay buffers 320 require calculation times. Therefore, a DDS may sample clocks faster than the components can correct. As a result, staggered sampling helps to prevent wasted bandwidth by limiting inputs to be sampled by the phase detector 305.

As stated above, the functionality of the DDS and its components may be placed in a testing mode. For one embodiment of the invention, the buffer control circuit 315 is an up/down counter. The functionality of the up/down counter 315 and adjustable delay buffer 320 may be checked using the scan register 325. To perform this test, the load control circuit signal is asserted and phase detector 305 and digital sampling filter 310 are disabled. Lead/lag signals, which are generated by the phase detector in normal operation, are not generated in testing mode. Instead, the up/down counter 315 receives inputs from scan register 325. Values are loaded into scan register 325 serially. The values are then communicated to the up/down counter 315 by asserting the up/down counter's load control signal. The values provided by the phase detector logic 305 to the up/down counter 315 are ignored.

For another embodiment of the invention, the functionality of the phase detector 305 and digital sampling filter 310 may be tested. The load register signal of the up/down counter 315 is asserted. For this embodiment of the invention, the values of the up/down counter 315 are loaded into the scan register 325. The lead/lag signals are then read from the scan register 325 through a serial output.

The scan register 325 may further be used for testing other system functionality not described above. The DDS is placed in testing mode to test the functionality of a component or a plurality of components of the system. At all other times, the DDS remains in an operating mode.

In the foregoing specification the invention has been described with reference to specific exemplary embodiments thereof. It will, however, be evident that various modification and changes may be made thereto without departure from the broader spirit and scope of the invention as set forth in the appended claims. The specification and drawings are, accordingly, to be regarded in an illustrative rather than restrictive sense.

What is claimed is:

1. A system comprising:
    a phase detector to compare a first clock and a second clock;
    a first buffer coupled to the phase detector, the first buffer having an adjustable delay input and generating an output signal, the generated output signal being a function of the adjustable delay input that is changed if a skew between the first clock and the second clock is greater than a defined threshold; and
    a digital sampling filter coupled to the phase detector, the digital sampling filter enables the phase detector.

2. The system of claim 1, further comprising a control circuit coupled to the phase detector, wherein the control circuit generates a control signal to change the delay of the first buffer.

3. The system of claim 2, wherein the control circuit is an up/down counter.

4. The system of claim 2, wherein the control circuit is a shift register.

5. The system of claim 1, wherein the threshold is defined by the phase detector.

6. The system of claim 1, wherein the first clock and the second clock are both modified by the adjustable delay.

7. The system of claim 1, wherein the digital sampling filter is a counter that periodically enables the phase detector.

8. The system of claim 1, wherein the digital sampling filter is a state machine to control the sampling of the first clock and the second clock to ensure system stability and to minimize jitter.

9. A system comprising:
a phase detector to compare a first clock and a second clock;
a first buffer coupled to the phase detector, wherein the first buffer has an adjustable delay input, wherein the first buffer generates an output signal, wherein the generated output signal is a function of the adjustable delay input, wherein the adjustable delay is changed if a skew between the first clock and the second clock is greater than a defined threshold;
a control circuit, coupled to the phase detector, to generate a control signal to change the delay of the first buffer; and
a scan register coupled to the control circuit, wherein the scan register enables system testing.

10. The system of claim 9, wherein the values are serially loaded to the scan register.

11. The system of claim 9, wherein the scan register reads data from the buffer control circuit.

12. A system comprising:
a phase detector to compare a first clock and a second clock;
a first buffer coupled to the phase detector, wherein the first buffer has an adjustable delay input, wherein the first buffer generates an output signal, wherein the generated output signal is a function of the adjustable delay input, wherein the adjustable delay is changed if a skew between the first clock and the second clock is greater than a defined threshold;
a control circuit, coupled to the phase detector, to generate a control signal to change the delay of the first buffer; and
the control signal is inverted and provided to a second buffer.

13. The system of claim 12, wherein the control signal increases the delay of the first buffet and decreases the delay of the second buffer at approximately the same time.

14. The system of claim 13, wherein the control signal decreases the delay of the first buffer and increases the delay of the second buffer at approximately the first time.

\* \* \* \* \*